(12) United States Patent
Wu et al.

(10) Patent No.: US 10,790,394 B2
(45) Date of Patent: *Sep. 29, 2020

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Po-Chi Wu, Zhubei (TW); Chai-Wei Chang, New Taipei (TW); Jung-Jui Li, Hsinchu (TW); Ya-Lan Chang, Toufen Township (TW); Yi-Cheng Chao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/390,975

(22) Filed: Apr. 22, 2019

(65) Prior Publication Data

US 2019/0252539 A1      Aug. 15, 2019

Related U.S. Application Data

(60) Continuation of application No. 15/601,576, filed on May 22, 2017, now Pat. No. 10,269,963, which is a
(Continued)

(51) Int. Cl.
*H01L 21/8238* (2006.01)
*H01L 29/78* (2006.01)
(Continued)

(52) U.S. Cl.
CPC ........ *H01L 29/785* (2013.01); *H01L 29/0653* (2013.01); *H01L 29/66545* (2013.01); *H01L 29/66795* (2013.01)

(58) Field of Classification Search
CPC .............. H01L 21/3003; H01L 29/785; H01L 29/66545; H01L 29/0653; H01L 29/66795;
(Continued)

(56) References Cited

U.S. PATENT DOCUMENTS 5,969,398 A    10/1999  Murakami
6,753,215 B2    6/2004  Kasuya
(Continued)

FOREIGN PATENT DOCUMENTS

CN       104637819 A      5/2015
DE    102014222562 A1    5/2015
(Continued)

*Primary Examiner* — Bitew A Dinke
(74) *Attorney, Agent, or Firm* — Slater Matsil, LLP

(57) ABSTRACT

A method for forming a semiconductor device structure is provided. The method includes forming a dielectric layer over a substrate. The dielectric layer has a trench passing through the dielectric layer. The method includes forming a gate stack in the trench. The method includes performing a hydrogen-containing plasma process over the gate stack. The method includes removing a top portion of the gate stack to form a first recess surrounded by the gate stack and the dielectric layer. The method includes forming a cap layer in the first recess to fill the first recess.

20 Claims, 14 Drawing Sheets

Related U.S. Application Data division of application No. 14/851,485, filed on Sep. 11, 2015, now Pat. No. 9,660,084.

(60) Provisional application No. 62/187,625, filed on Jul. 1, 2015.

(51) Int. Cl.
  H01L 29/06 (2006.01)
  H01L 29/66 (2006.01)

(58) Field of Classification Search
  CPC ......... H01L 29/4236; H01L 21/823842; H01L 21/823857; H01L 21/82345
  See application file for complete search history.

(56) References Cited

U.S. PATENT DOCUMENTS

| | | | |
|---|---|---|---|
| 8,609,495 | B2 | 12/2013 | Gan et al. |
| 8,809,139 | B2 | 8/2014 | Huang et al. |
| 10,269,963 | B2 * | 4/2019 | Wu ....................... H01L 29/785 |
| 2003/0104706 | A1 | 6/2003 | Mitsuhashi et al. |
| 2003/0214043 | A1 | 11/2003 | Saitoh et al. |
| 2005/0170543 | A1* | 8/2005 | Sugawara ......... H01L 21/28176 438/38 |
| 2005/0245036 | A1* | 11/2005 | Datta ................ H01L 21/28114 438/287 |
| 2005/0255684 | A1* | 11/2005 | Koldiaev .............. H01L 21/265 438/528 |
| 2008/0124922 | A1* | 5/2008 | Kawamura ....... H01L 21/26506 438/664 |
| 2009/0087974 | A1 | 4/2009 | Waite et al. |
| 2010/0015766 | A1* | 1/2010 | McMullan ........ H01L 21/26506 438/232 |
| 2010/0127335 | A1* | 5/2010 | Niimi ................ H01L 29/66545 257/368 |
| 2012/0012948 | A1 | 1/2012 | Yeh et al. |
| 2012/0248550 | A1 | 10/2012 | Huang et al. |
| 2012/0286372 | A1* | 11/2012 | Lavoie ............. H01L 21/28176 257/410 |
| 2013/0075784 | A1 | 3/2013 | Ikeda |
| 2013/0075827 | A1 | 3/2013 | Lee et al. |
| 2014/0061757 | A1 | 3/2014 | Kim et al. |
| 2014/0231885 | A1 | 8/2014 | Xie et al. |
| 2015/0061027 | A1 | 3/2015 | Hong et al. |
| 2015/0129962 | A1 | 5/2015 | Xie et al. |
| 2015/0270142 | A1 | 9/2015 | Liu et al. |
| 2015/0311081 | A1 | 10/2015 | Xie et al. |
| 2016/0020104 | A1* | 1/2016 | Lin .................. H01L 21/28088 257/412 |
| 2016/0020118 | A1 | 1/2016 | Park et al. |
| 2016/0079395 | A1* | 3/2016 | Sim .................. H01L 29/66795 438/283 |
| 2016/0104644 | A1* | 4/2016 | Liu .................. H01L 29/66553 257/401 |
| 2016/0104704 | A1 | 4/2016 | Fang et al. |
| 2016/0163601 | A1 | 6/2016 | Xie et al. |
| 2016/0204221 | A1 | 7/2016 | He et al. |
| 2016/0284817 | A1 | 9/2016 | Basker et al. |
| 2016/0308012 | A1 | 10/2016 | Song et al. |
| 2017/0033105 | A1 | 2/2017 | Wang |
| 2017/0162503 | A1* | 6/2017 | Olac-Vaw ......... H01L 29/42376 |
| 2017/0345912 | A1* | 11/2017 | Kim .................. H01L 29/66545 |

FOREIGN PATENT DOCUMENTS

| | | |
|---|---|---|
| KR | 20030089474 A | 11/2003 |
| KR | 20130033270 A | 4/2013 |
| KR | 20140104890 A | 8/2014 |
| TW | 200933820 A | 8/2009 |
| TW | 201413969 A | 4/2014 |
| WO | 2016028266 A1 | 2/2016 |

\* cited by examiner

SEMICONDUCTOR DEVICE STRUCTURE AND METHOD FOR FORMING THE SAME

PRIORITY CLAIM AND CROSS-REFERENCE

This application is a continuation of U.S. patent application Ser. No. 15/601,576, filed on May 22, 2017, entitled "Semiconductor Device Structure and Method for Forming the Same," which is a divisional of U.S. patent application Ser. No. 14/851,485, filed Sep. 11, 2015, now U.S. Pat. No. 9,660,084, issued on May 23, 2017, which claims the benefit of U.S. Provisional Application No. 62/187,625, filed on Jul. 1, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
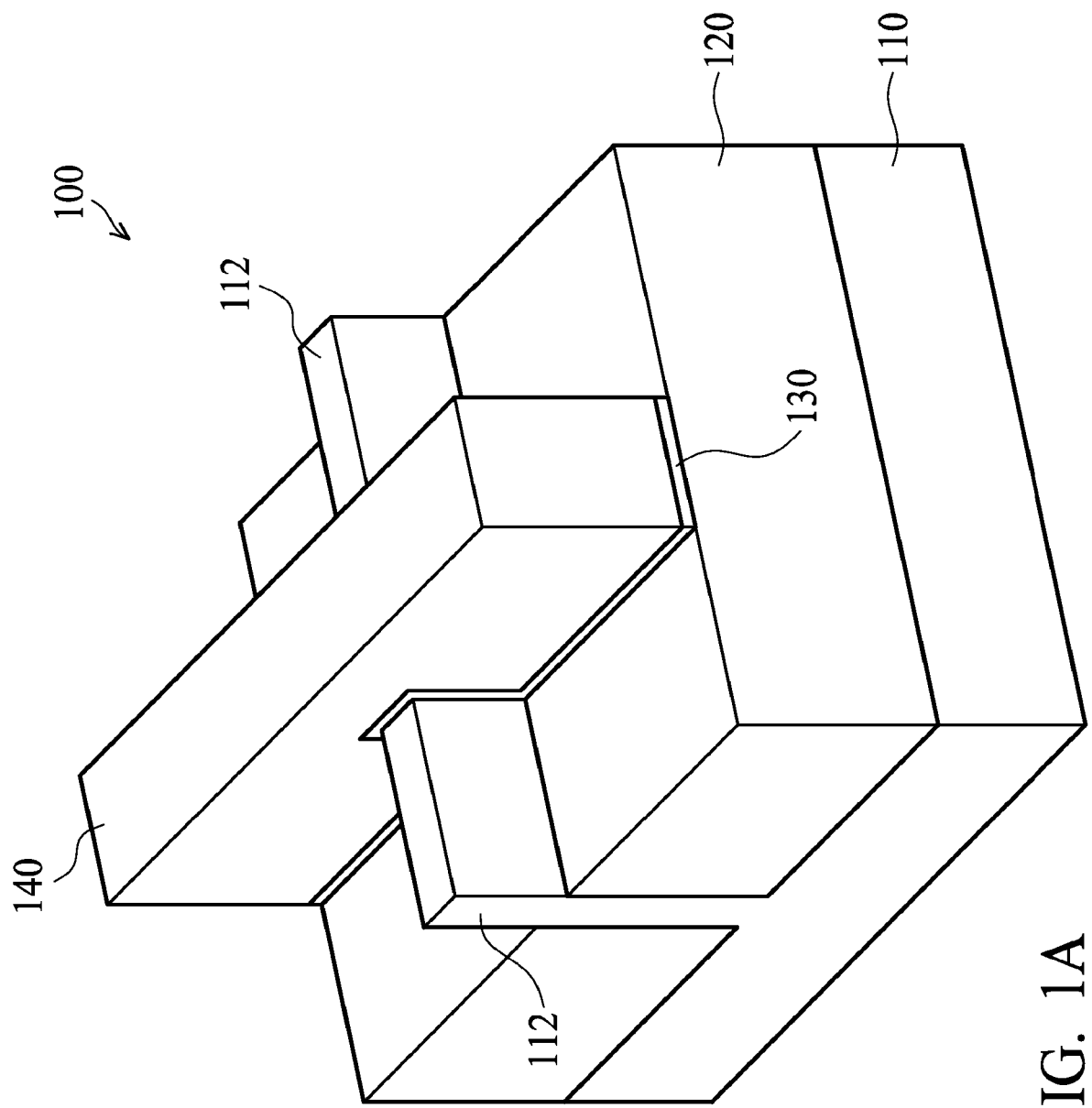
FIG. 1A is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
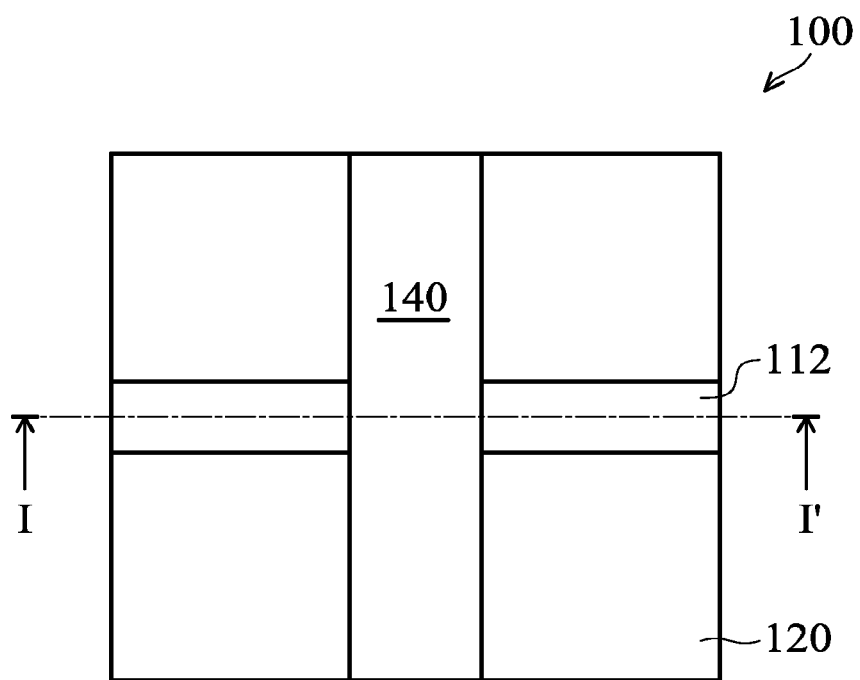
FIG. 1B is a top view of the semiconductor device structure of FIG. 1A, in accordance with some embodiments.
Figure 2A:
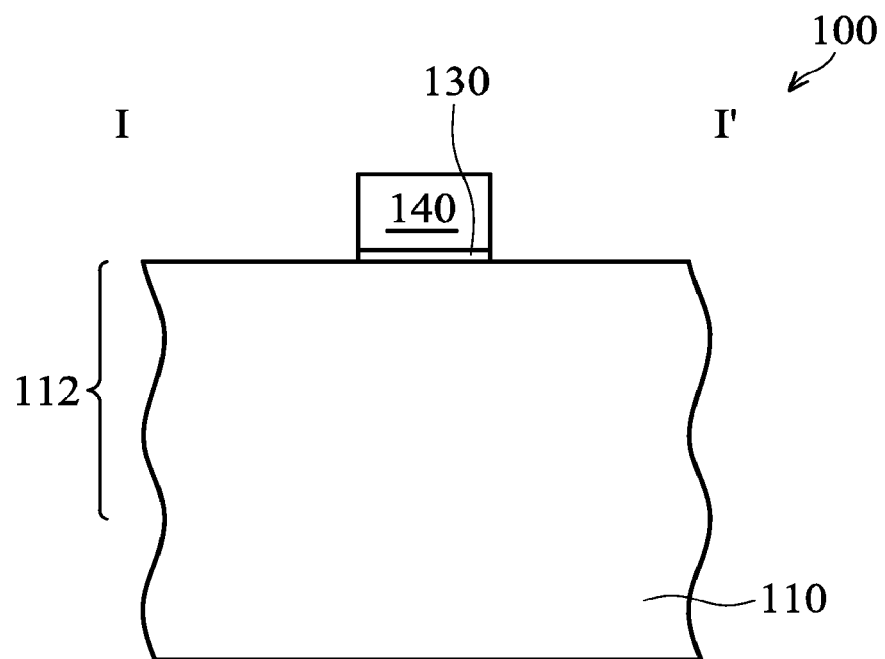
FIGS. 2A-2N are cross-sectional views of various stages of a process for forming a semiconductor device structure, in accordance with some embodiments.

FIG. 1A is a perspective view of a semiconductor device structure 100, in accordance with some embodiments. FIG. 1B is a top view of the semiconductor device structure 100 of FIG. 1A, in accordance with some embodiments. FIG. 2A is a cross-sectional view illustrating the semiconductor device structure 100 along a sectional line I-I' in FIG. 1B, in accordance with some embodiments.

As shown in FIGS. 1A, 1B, and 2A, a substrate 110 is provided, in accordance with some embodiments. The substrate 110 includes a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped polysilicon layer.

As shown in FIGS. 1A, 1B, and 2A, the substrate 110 has a fin structure 112, in accordance with some embodiments. In some embodiments, the fin structure 112 is formed by patterning the substrate 110. For example, the formation of the fin structure 112 includes forming a patterned photoresist layer with openings (not shown) overlying the substrate 110; performing an etching process to remove a portion of the substrate 110 through openings; and removing the patterned photoresist layer. The etching process includes a reactive ion etch (RIE) or other suitable processes.

As shown in FIGS. 1A, 1B, and 2A, an isolation layer 120 is formed over the substrate 110 and adjacent to the fin structure 112, in accordance with some embodiments. The isolation layer 120 includes an insulating material, in accordance with some embodiments. The insulating material includes silicon oxide, silicon nitride, silicon oxynitride, another applicable material, or a combination thereof.

The formation of the isolation layer 120 includes forming an isolation material layer (not shown) over the substrate 110; and performing an etching back process on the isolation material layer to expose top portions of the fin structure 112, in accordance with some embodiments. The etching back process includes a dry etching process, in accordance with some embodiments.

As shown in FIGS. 1A, 1B, and 2A, a dummy gate dielectric layer 130 is formed over the fin structure 112, in accordance with some embodiments. The dummy gate dielectric layer 130 is made of silicon oxide, in accordance with some embodiments. The dummy gate 140 is formed over the dummy gate dielectric layer 130, in accordance with some embodiments. The dummy gate 140 is made of polysilicon, in accordance with some embodiments.

The formation of the dummy gate dielectric layer 130 and the dummy gate 140 includes depositing a dummy gate dielectric material layer (not shown) over the isolation layer 120 and the fin structure 112; depositing a dummy gate material layer (not shown) over the dummy gate dielectric material layer; and patterning the dummy gate material layer and the dummy gate dielectric material layer by a photolithography process and an etching process, in accordance with some embodiments.

The dummy gate dielectric material layer is deposited using a chemical vapor deposition process (CVD process), in accordance with some embodiments. The dummy gate material layer is deposited using a chemical vapor deposition process, in accordance with some embodiments.

Figure 2B:
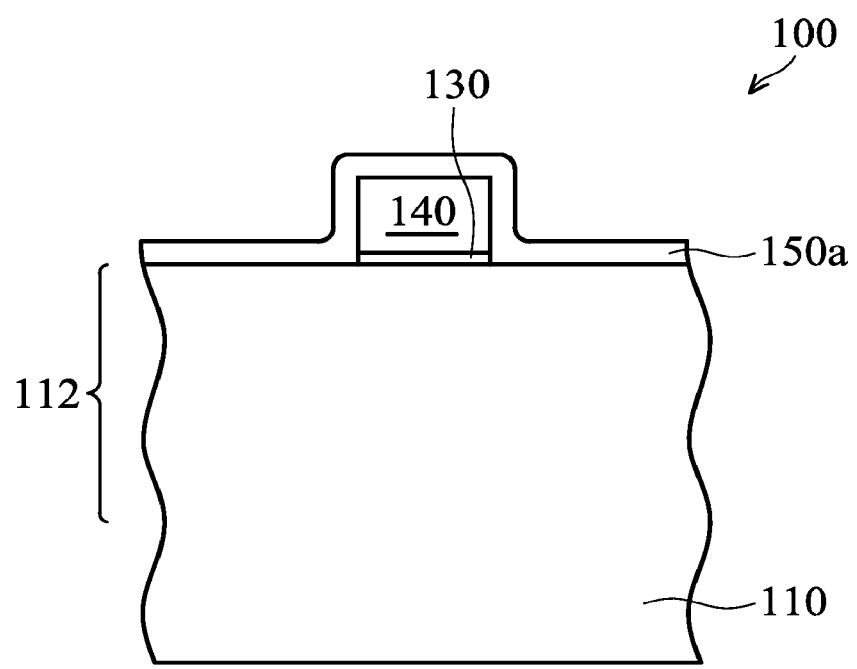
Figure 2C:
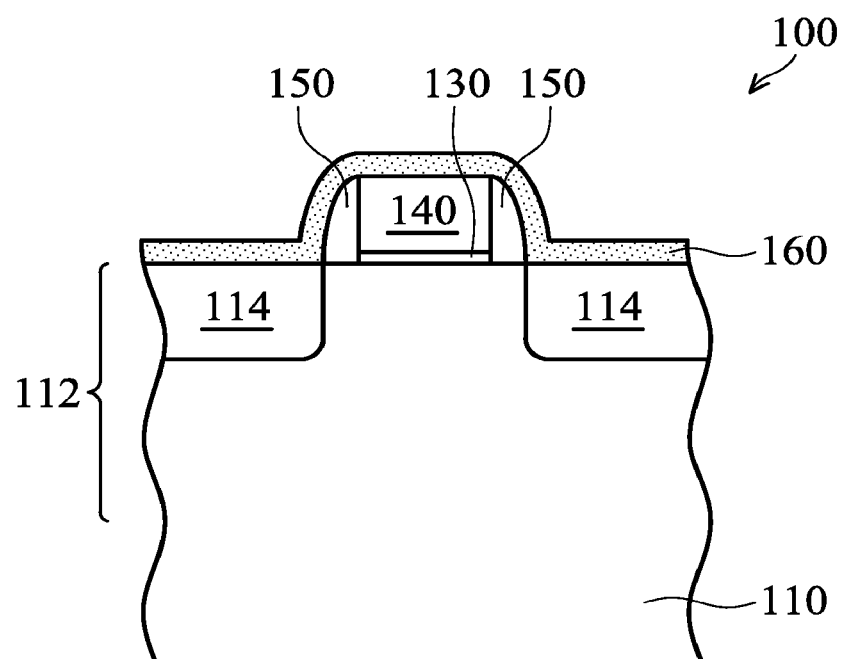
Figure 2D:
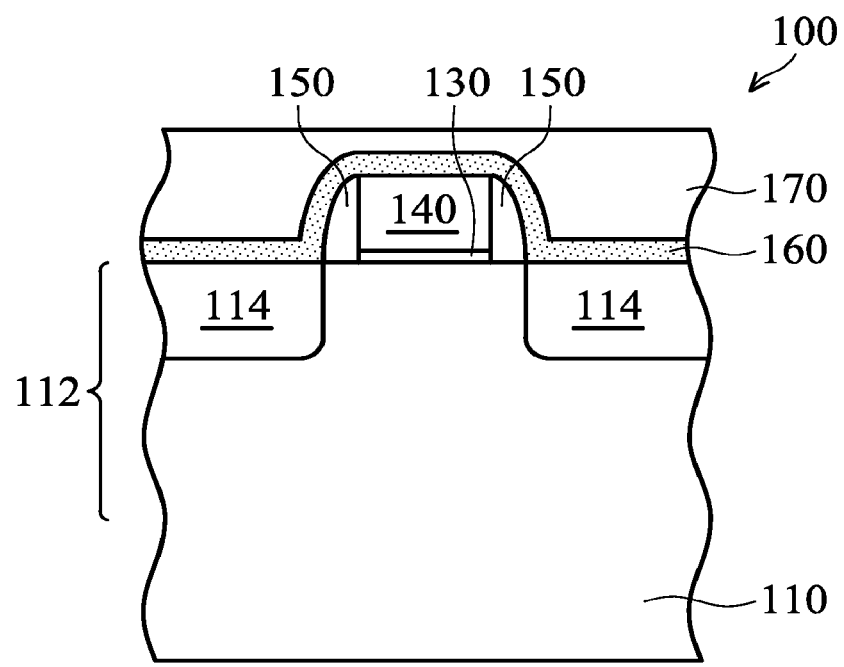
Figure 2E:
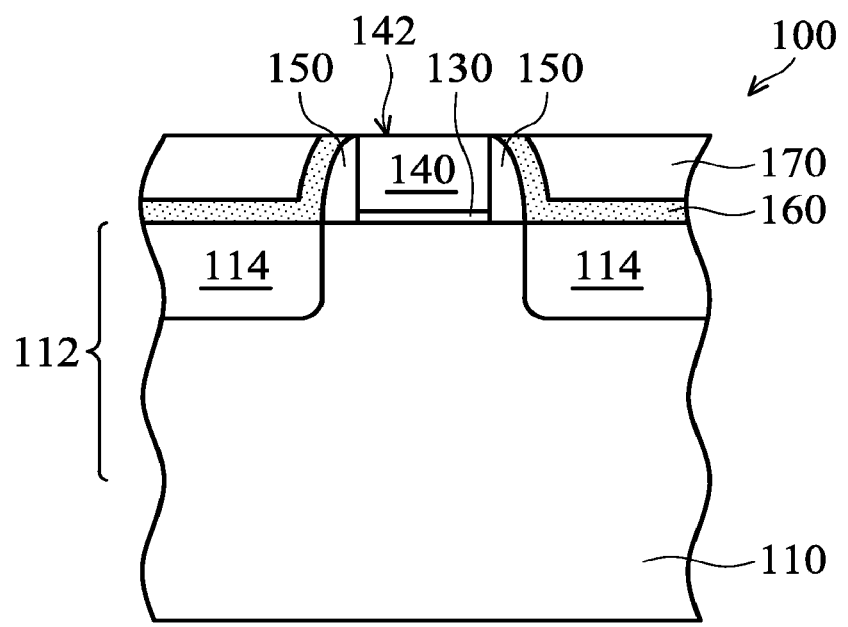
Figure 2F:
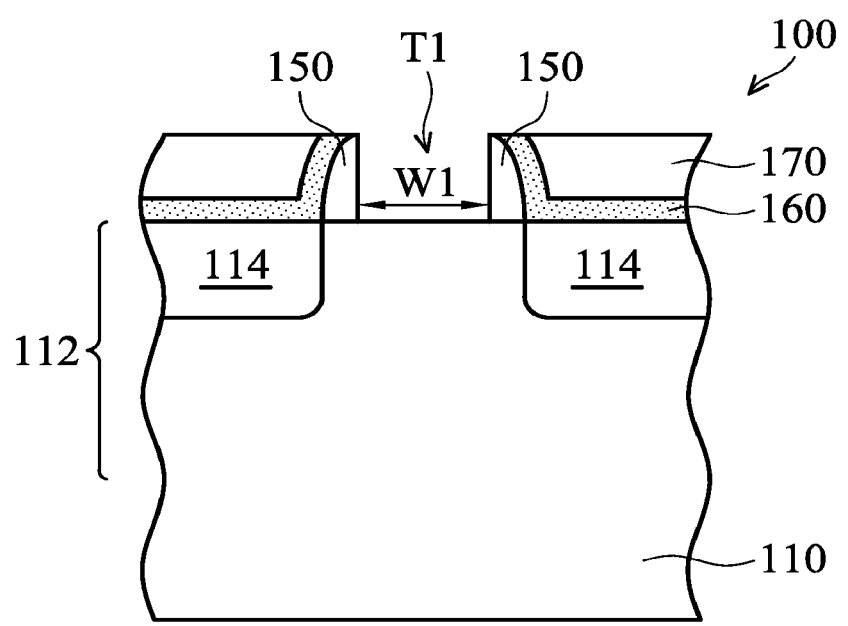
Figure 2G:
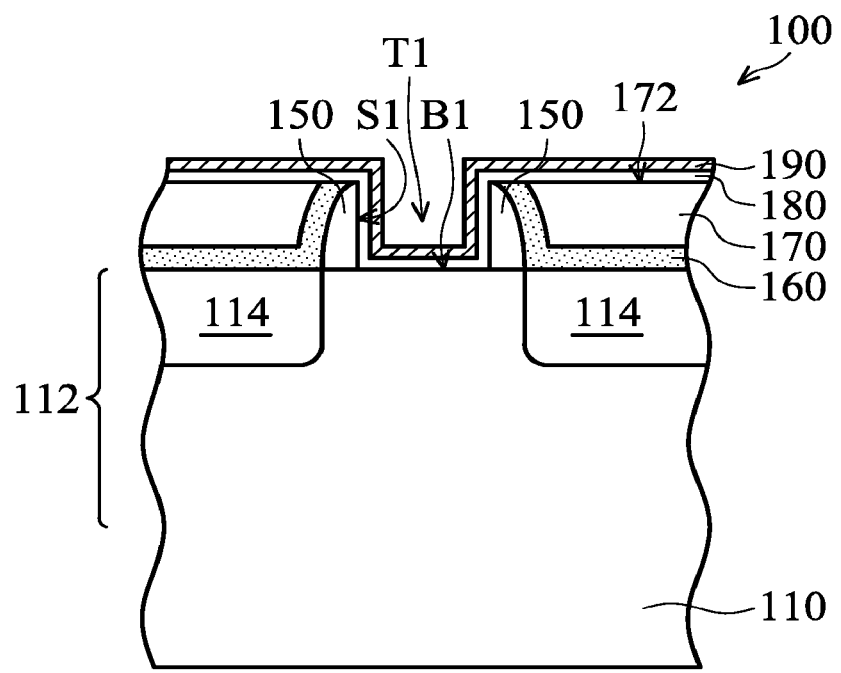
Figure 2H:
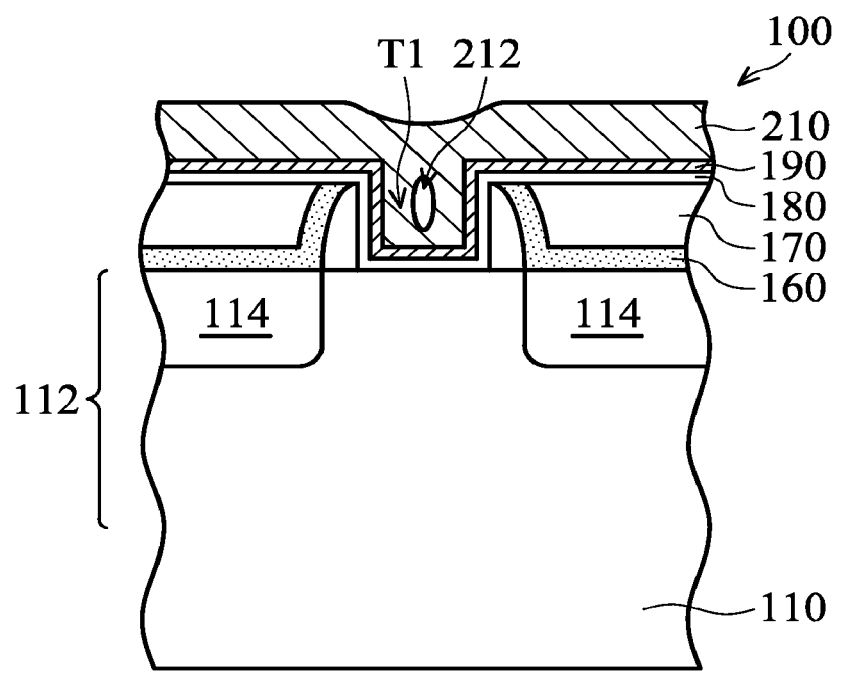
Figure 2I:
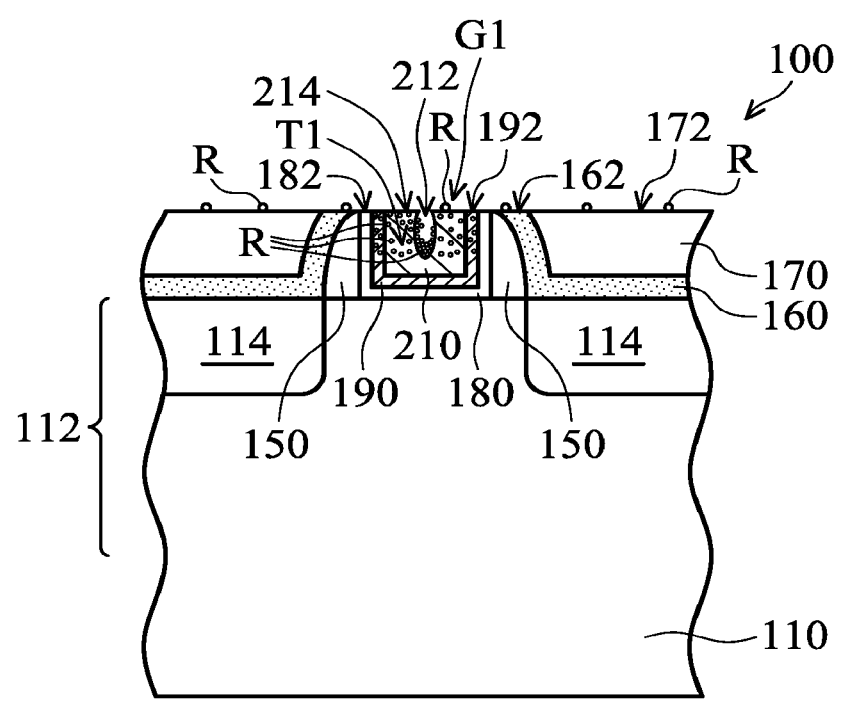
Figure 2J:
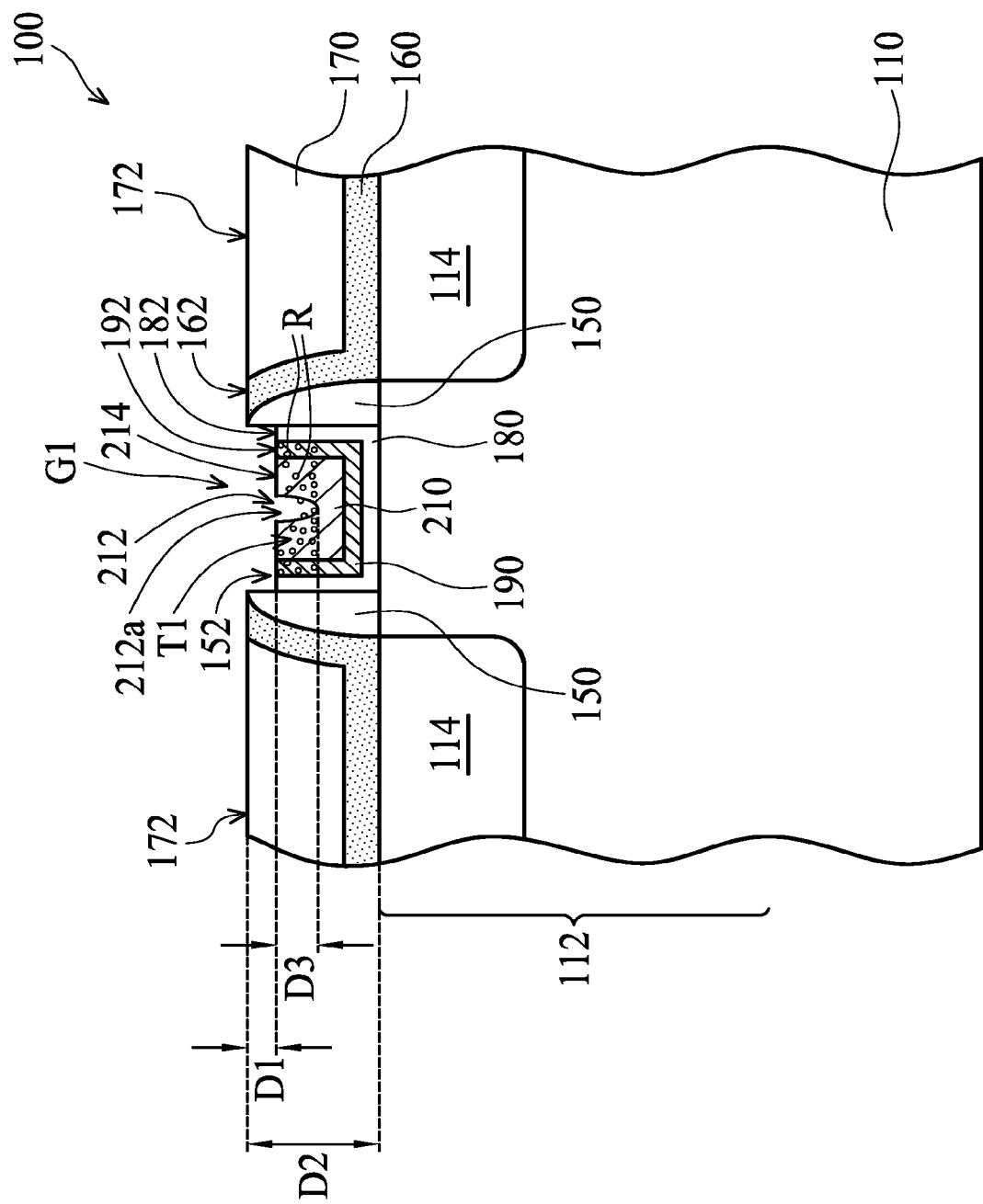
Figure 2K:
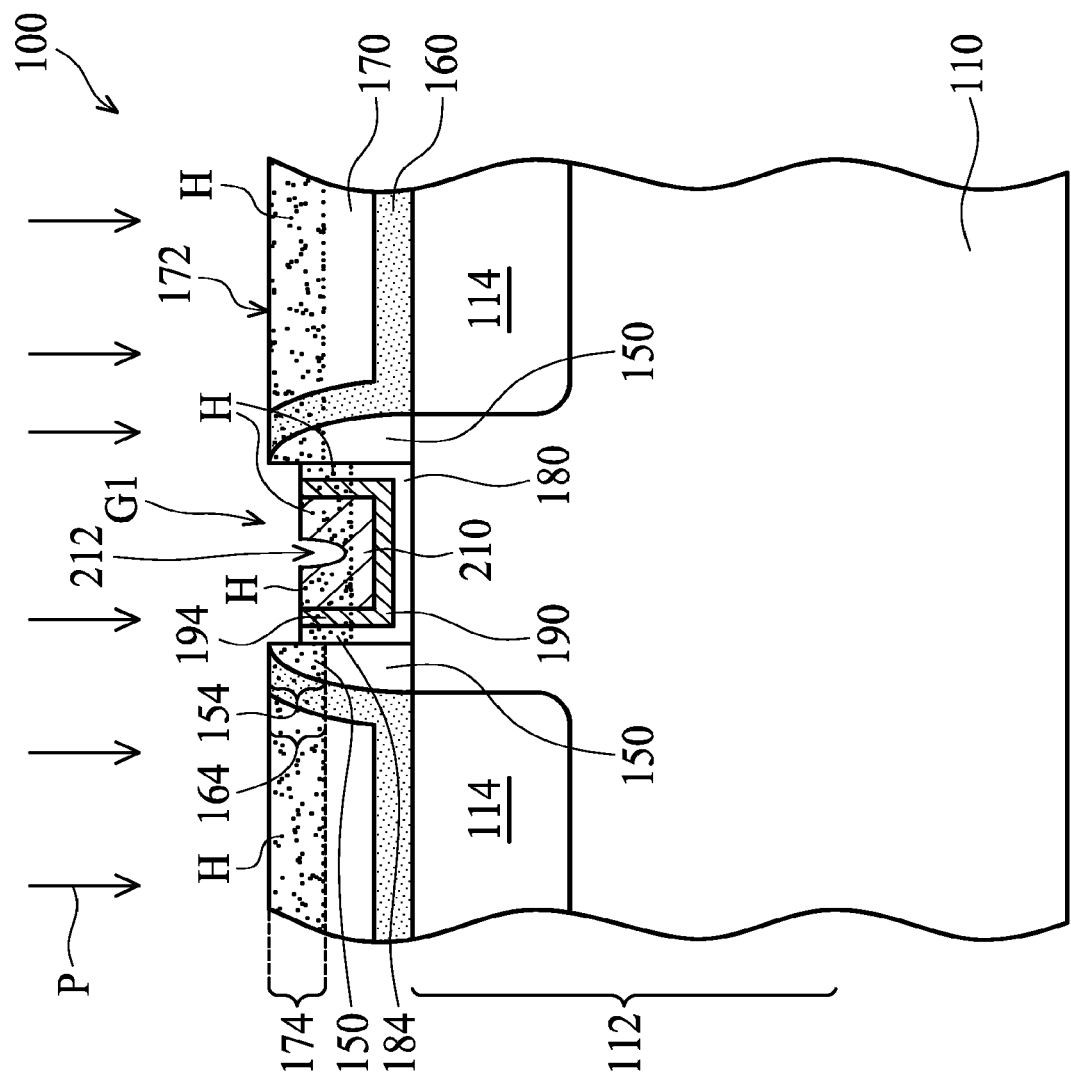
Figure 2L:
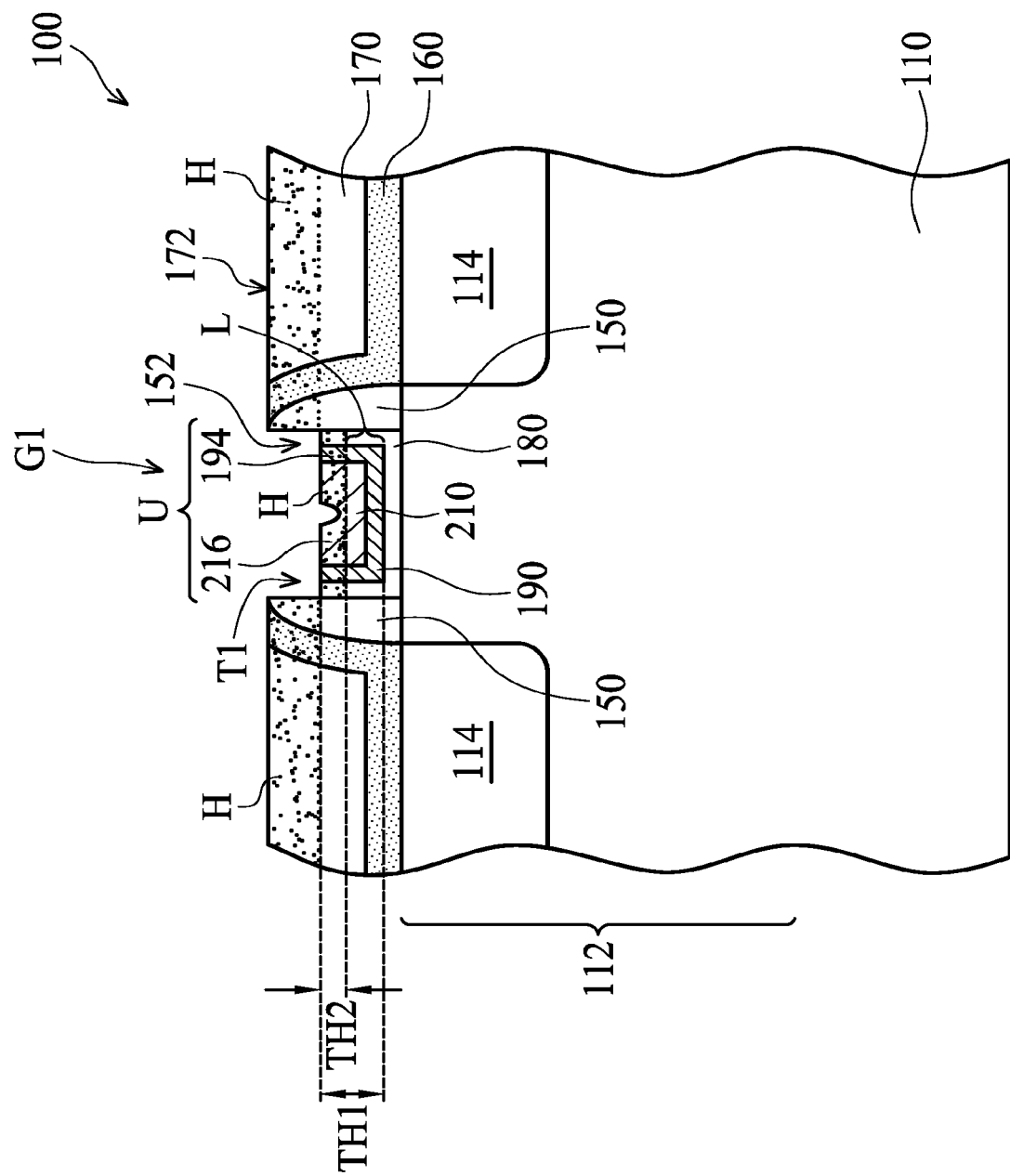
Figure 2M:
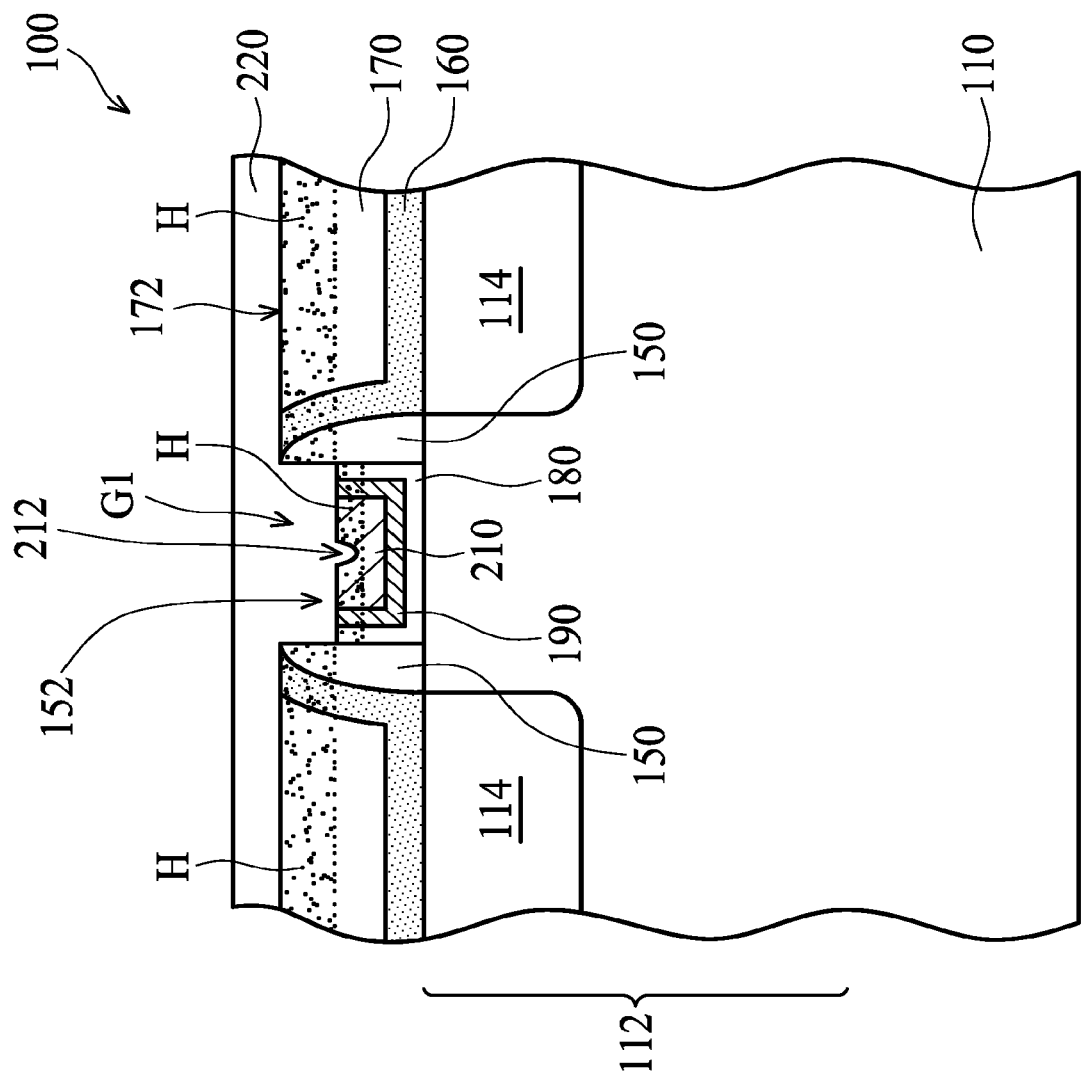
Figure 2N:
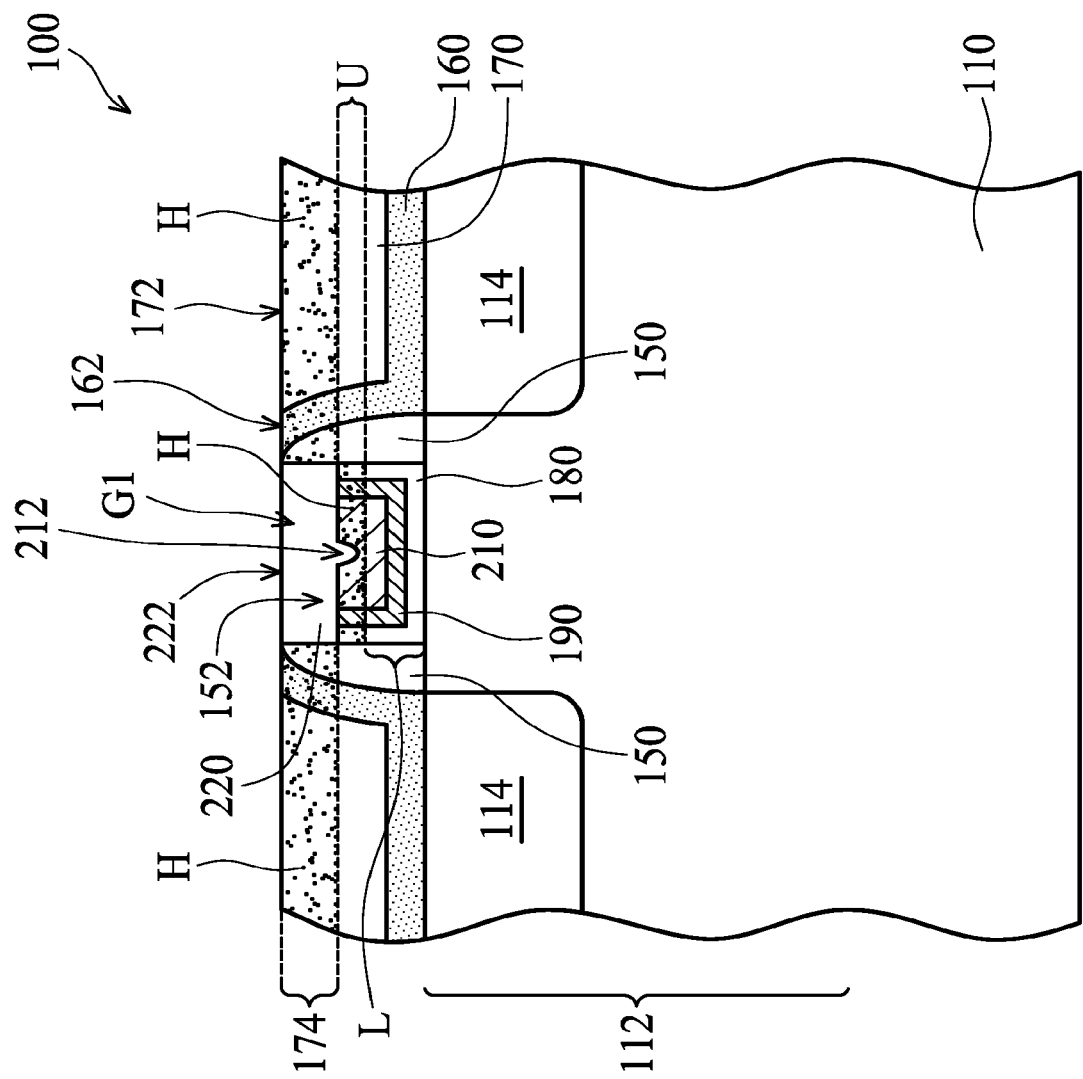
Figure 3:
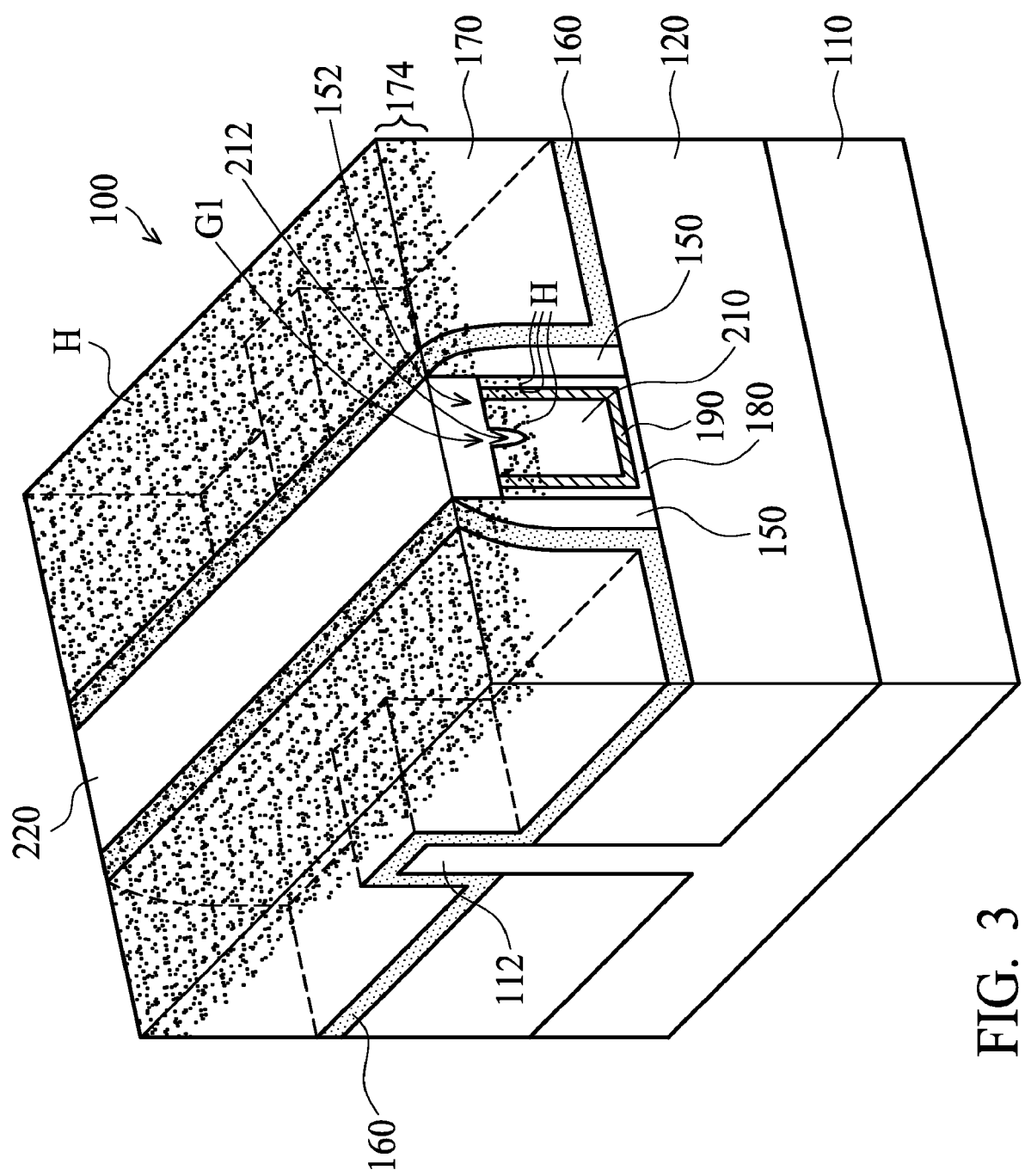
FIG. 3 is a perspective view of the semiconductor device structure of FIG. 2N, in accordance with some embodiments.

FIGS. 2A-2N are cross-sectional views of various stages of a process for forming a semiconductor device structure 100, in accordance with some embodiments. FIG. 3 is a perspective view of the semiconductor device structure 100 of FIG. 2N, in accordance with some embodiments.

After the stage of FIG. 2A, as shown in FIG. 2B, a spacer layer 150a is deposited over the isolation layer 120 to cover the dummy gate dielectric layer 130 and the dummy gate 140, in accordance with some embodiments. The spacer layer 150a includes an insulating material, such as silicon oxide or silicon nitride. The spacer layer 150a is formed using a chemical vapor deposition process, in accordance with some embodiments.

As shown in FIGS. 2B and 2C, an anisotropic etching process is performed to remove a portion of the spacer layer 150a, in accordance with some embodiments. The spacer layer 150a remaining over the sidewalls of the dummy gate 140 and the dummy gate dielectric layer 130 forms spacers 150, in accordance with some embodiments.

The spacers 150 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 2C, heavily doped regions 114 are formed in the fin structure 112, in accordance with some embodiments. The heavily doped regions 114 are formed in the fin structure 112 exposed by the dummy gate 140 and the spacers 150, in accordance with some embodiments.

The heavily doped regions 114 are formed using an ion implantation process, in accordance with some embodiments. The ion implantation process uses the dummy gate 140 and the spacers 150 as an ion implantation mask, in accordance with some embodiments. The ion implantation process is performed to introduce p-type impurities (e.g., boron) or n-type impurities (e.g., phosphorus) into the fin structure 112, in accordance with some embodiments.

Two adjacent heavily doped regions 114 are a heavily doped source region and a heavily doped drain region, in accordance with some embodiments. The heavily doped regions 114 are located at the two opposite sides of the dummy gate 140, in accordance with some embodiments.

Thereafter, in some embodiments (not shown), stressors are formed in the heavily doped regions 114 by using suitable processes, in accordance with some embodiments. The suitable processes include, for example, an etching process for removing a portion of the fin structure 112 and a selective epitaxial growth (SEG) process. Depending on the desired type of the resulting FinFET device, either stressors applying a compressive stress to the channel region (such as SiGe stressors) or stressors applying a tensile stress to the channel region (such as SiC stressors) are formed.

As shown in FIG. 2C, an etch stop layer 160 is formed over the substrate 110 to cover the heavily doped regions 114, in accordance with some embodiments. The etch stop layer 160 further covers the dummy gate 140, the spacers 150, and the isolation layer 120, in accordance with some embodiments. The etch stop layer 160 includes a dielectric material, in accordance with some embodiments. The etch stop layer 160 includes silicon nitride, in accordance with some embodiments.

As shown in FIG. 2D, a dielectric layer 170 is deposited over the etch stop layer 160, in accordance with some embodiments. The dielectric layer 170 covers the isolation layer 120, the fin structure 112, the dummy gate 140, and the spacers 150, in accordance with some embodiments.

The dielectric layer 170 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 170 is deposited using a CVD process, a HDPCVD process, a spin-on process, a sputtering process, or a combination thereof, in accordance with some embodiments.

Afterwards, as shown in FIG. 2E, a planarization process is performed on the dielectric layer 170 until a top surface 142 of the dummy gate 140 is exposed, in accordance with some embodiments. The planarization process includes a chemical mechanical polishing (CMP) process, in accordance with some embodiments. After the planarization process is performed, the dielectric layer 170 has a substantially planar surface to facilitate subsequent process steps.

As shown in FIG. 2F, the dummy gate 140 is removed, in accordance with some embodiments. The removal process for removing the dummy gate 140 includes a wet etching process, a dry etching process, or a combination thereof, in accordance with some embodiments. In some embodiments, the dummy gate dielectric layer 130 is also removed.

After the dummy gate 140 and the dummy gate dielectric layer 130 are removed, a trench T1 is formed between the spacers 150, in accordance with some embodiments. The trench T1 exposes a portion of the fin structure 112, in accordance with some embodiments. The trench T1 has a width W1 ranging from about 10 nm to about 35 nm, in accordance with some embodiments. The width W1 ranges from about 15 nm to about 35 nm, in accordance with some embodiments.

As shown in FIG. 2G, a gate dielectric layer 180 is formed over a bottom surface B1 of the trench T1, in accordance with some embodiments. The gate dielectric layer 180 is further formed over an inner wall S1 of the trench T1, an upper surface 172 of the dielectric layer 170, and the spacers 150, in accordance with some embodiments.

The gate dielectric layer 180 includes a dielectric material, such as a high dielectric constant (high-k) material. The high-k material includes hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 180 is deposited by any suitable process, such as atomic layer deposition (ALD), chemical vapor deposition (CVD), physical vapor deposition (PVD), sputtering, plating, other suitable processes, or a combination thereof, in accordance with some embodiments. In some embodiments, the gate dielectric layer 180 needs to be further annealed.

An intermediate dielectric layer (not shown) may be formed over the fin structure 112 before the gate dielectric layer 180 is formed. The intermediate dielectric layer includes a suitable dielectric material, such as silicon oxide, hafnium silicate, silicon oxynitride, or a combination thereof.

As shown in FIG. 2G, a work function layer 190 is deposited over the gate dielectric layer 180, in accordance with some embodiments. The work function layer 190 provides a desired work function for transistors to enhance device performance including improved threshold voltage.

In the embodiments of forming an N-type FinFET, the work function layer 190 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a P-type FinFET, the work function layer 190 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or a combination thereof. The work function layer 190 includes aluminum, titanium, or a combination thereof, in accordance with some embodiments. The work function layer 190 is deposited using a PVD process, CVD process, ALD process, plating process, another suitable method, or a combination thereof, in accordance with some embodiments.

As shown in FIG. 2H, a gate electrode layer 210 (also called a metal gate electrode layer) is deposited over the work function layer 190 to fill the trench T1, in accordance with some embodiments. In some embodiments, the gate electrode layer 210 has a void 212 in the trench T1. The void 212 is a closed void, in accordance with some embodiments. The gate electrode layer 210 includes a suitable metal material, such as aluminum, tungsten, gold, platinum, cobalt, another suitable metal, an alloy thereof, or a combination thereof, in accordance with some embodiments.

The deposition process includes an atomic layer deposition (ALD) process and a chemical vapor deposition (CVD) process, in accordance with some embodiments. In some other embodiments, the gate electrode layer 210 is deposited using a PVD process, a plating process, the like, or a combination thereof.

As shown in FIG. 2I, the gate electrode layer 210, the work function layer 190, and the gate dielectric layer 180 outside of the trench T1 are removed, in accordance with some embodiments. The gate electrode layer 210 and the work function layer 190 remaining in the trench T1 together form a gate stack G1, in accordance with some embodiments.

The void 212 is opened by the removal process, in accordance with some embodiments. The removal process includes performing a planarization process, in accordance with some embodiments. The planarization process includes a chemical mechanical polishing (CMP) process, in accordance with some embodiments.

After the planarization process, residues R from the planarization process are formed over top surfaces 214, 192, 182, 162, and 172 of the gate electrode layer 210, the work function layer 190, the gate dielectric layer 180, the etch stop layer 160, and the dielectric layer 170, in accordance with some embodiments. The residues R are formed from the gate electrode layer 210, the work function layer 190, the gate dielectric layer 180, and the polishing slurry used in the planarization process, in accordance with some embodiments.

The residues R include a material of the gate electrode layer 210, the work function layer 190, the gate dielectric layer 180, and the polishing slurry, in accordance with some embodiments. The polishing slurry includes carbon, such as a polymer material, in accordance with some embodiments. The residues R include tungsten, aluminum, gold, platinum, cobalt, and/or carbon (from the polishing slurry), in accordance with some embodiments.

A portion of the residues R is in the void 212, in accordance with some embodiments. A portion of the residues R diffuses into the gate electrode layer 210 and the work function layer 190, in accordance with some embodiments. Since the etching selectivity ratio between metal and carbon is high, the residues R of carbon may hinder the etching process performed on the gate electrode layer 210 and the work function layer 190 subsequently.

As shown in FIG. 2J, a cleaning process is performed to remove the residues R, top portions of the gate electrode layer 210, the work function layer 190, and the gate dielectric layer 180, in accordance with some embodiments. After the cleaning process, a recess 152 is formed between the spacers 150 and the gate stack G1, in accordance with some embodiments. The recess 152 is surrounded by the spacers 150 (or the dielectric layer 170) and the gate stack G1, in accordance with some embodiments. The recess 152 is connected to the void 212, in accordance with some embodiments.

The cleaning process removes the residues R over the top surfaces 214, 192, 182, 162, and 172 and the residues R in the void 212, in accordance with some embodiments. Therefore, the cleaning process helps a subsequently-performed removal process for removing the residues R in the gate electrode layer 210 and the work function layer 190, in accordance with some embodiments. After the cleaning process, the residues R diffusing into the gate electrode layer 210 and the work function layer 190 and/or a portion of the residues R in the void 212 may remain.

Since the cleaning process removes the top portion of the gate electrode layer 210, the cleaning process may enlarge the opening 212a of the void 212 and reduce the depth D3 of the void 212. Therefore, the cleaning process helps a subsequently-performed removal process for removing the residues R in the void 212, in accordance with some embodiments.

The recess 152 has a depth D1 ranging from about 5 nm to about 30 nm, in accordance with some embodiments. A ratio of the depth D1 to a depth D2 of the trench T1 ranges from about 0.08 to about 0.5, in accordance with some embodiments. If the ratio (D1/D2) is less than 0.08, the opening 212a of the void 212 may be too small to remove the residues R in the void 212. If the ratio (D1/D2) is greater than 0.5, the thickness of the gate stack G1 may be too small to perform the subsequent process.

The cleaning process includes an etching back process, in accordance with some embodiments. The etching back process includes a dry etching process, in accordance with some embodiments. The dry etching process includes a plasma etching process, in accordance with some embodiments. The plasma etching process uses a process gas that includes fluorine and/or chlorine, in accordance with some embodiments.

As shown in FIG. 2K, a hydrogen-containing plasma process P is performed on the gate electrode layer 210, the work function layer 190, the gate dielectric layer 180, the spacers 150, the etch stop layer 160, and the dielectric layer 170, in accordance with some embodiments. The hydrogen-containing plasma process P uses a process gas includes $H_2$, in accordance with some embodiments.

Therefore, after the hydrogen-containing plasma process P, upper portions 216, 194, 184, 154, 164, and 174 of the gate electrode layer 210, the work function layer 190, the gate dielectric layer 180, the spacers 150, the etch stop layer 160, and the dielectric layer 170 are implanted with hydrogen atoms H, in accordance with some embodiments. The upper portions 216, 194, 184, 154, 164, and 174 also referred to as hydrogen-containing portions 216, 194, 184, 154, 164, and 174 of the gate electrode layer 210, the work function layer 190, the gate dielectric layer 180, the spacers 150, the etch stop layer 160, and the dielectric layer 170, in accordance with some embodiments.

The process gas further includes $N_2$, in accordance with some embodiments. Therefore, after the hydrogen-containing plasma process P, the hydrogen-containing portions 216, 194, 184, 154, 164, and 174 are further implanted with nitrogen atoms, in accordance with some embodiments.

In the hydrogen-containing plasma process P, the hydrogen atoms H penetrate into the gate electrode layer 210 and the work function layer 190 and are implanted into the void 212, in accordance with some embodiments. Therefore, the hydrogen atoms H react with the residues R of carbon in the gate electrode layer 210, the work function layer 190, and the void 212 to volatilize the residues R of carbon into a gaseous hydrocarbon compound (such as $CH_4$).

As a result, the residues R of carbon in the void 212, the gate electrode layer 210, and the work function layer 190 are reduced by the hydrogen-containing plasma process P, in accordance with some embodiments. Therefore, the hydrogen-containing plasma process P helps the etching process performed on the gate electrode layer 210 and the work function layer 190 subsequently.

Furthermore, since the cleaning process of FIG. 2J uses a process gas that includes chlorine, the chlorine atoms (not shown) may be in the gate electrode layer 210 and the work function layer 190. The hydrogen atoms H react with the chlorine atoms to volatilize the chlorine atoms into a gaseous chlorine compound (such as HCl), which reduces the defects in the gate electrode layer 210 and the work function layer 190 resulting from the chlorine atoms. Therefore, the hydrogen-containing plasma process P improves the electrical properties and the reliability of the gate electrode layer 210 and the work function layer 190, in accordance with some embodiments.

The hydrogen-containing plasma process P is performed at a processing temperature ranging from about 200° C. to about 400° C., in accordance with some embodiments. If the processing temperature ranging is lower than 200° C., the hydrogen atoms H may be unable to volatilize the residues R of carbon into the gaseous hydrocarbon compound. If the processing temperature ranging is higher than 400° C., the processing temperature may affect (or damage) the layers of the semiconductor device structure 100.

As shown in FIG. 2L, top portions of the gate dielectric layer 180, the work function layer 190, and the gate electrode layer 210 in the trench T1 are removed, in accordance with some embodiments. The gate stack G1 has a thickness TH1, in accordance with some embodiments.

The hydrogen-containing portions 216 and 194 of the gate electrode layer 210 and the work function layer 190 together form a hydrogen-containing portion U of the gate stack G1, in accordance with some embodiments. The hydrogen-containing portion U has a thickness TH2, in accordance with some embodiments. In some embodiments, a ratio of the thickness TH2 to the thickness TH1 ranges from about 0.3 to about 0.5.

In some embodiments, the first concentration of the hydrogen atoms H in the hydrogen-containing portion U is greater than the second concentration of the hydrogen atoms H in a lower portion L of the gate stack G1. In some embodiments, a ratio of the first concentration to the second concentration ranges from about 2 to 100.

The removal process includes an etching process, in accordance with some embodiments. The etching process includes an anisotropic etching process, such as a dry etching process, in accordance with some embodiments. The dry etching process includes a plasma etching process, in accordance with some embodiments. The plasma etching process uses a process gas that includes fluorine and/or chlorine, in accordance with some embodiments.

Since the cleaning process removes the residues R (as shown in FIG. 2J), the cleaning process improves the yield of the removal process of FIG. 2L, in accordance with some embodiments. Since the residues R of carbon in the gate stack G1 are removed by the hydrogen-containing plasma process P (as shown in FIG. 2K), the hydrogen-containing plasma process P may improves the electrical properties of the gate stack G1 and the etching of the work function layer 190 and/or the gate electrode layer 210 of FIG. 2L.

As shown in FIG. 2M, a cap layer 220 is formed over the gate stack G1 to fill the recess 152 and the void 212, in accordance with some embodiments. The cap layer 220 covers the gate stack G1, the spacers 150, the etch stop layer 160, and the dielectric layer 170, in accordance with some embodiments. The cap layer 220 includes an insulating material, in accordance with some embodiments.

The cap layer 220 and the dielectric layer 170 are made of different material, in accordance with some embodiments. The cap layer 220 includes silicon nitride, in accordance with some embodiments. The cap layer 220 is formed by a CVD process, a PVD process, or another suitable process.

The cap layer 220 is configured to prevent contacts from shorting with the gate stack G1, in accordance with some embodiments.

As shown in FIGS. 2N and 3, the cap layer 220 outside of the recess 152 is removed, in accordance with some embodiments. The removal process includes performing a planarization process, in accordance with some embodiments. The planarization process includes a chemical mechanical polishing (CMP) process, in accordance with some embodiments. After the planarization process, a top surface 222 of the cap layer 220, a top surface 162 of the etch stop layer 160, and the top surface 172 of the dielectric layer 170 are aligned with each other, in accordance with some embodiments.

The hydrogen-containing portion U of the gate stack G1 is under and adjacent to the cap layer 220, in accordance with some embodiments. The hydrogen-containing portion U is between the lower portion L and the cap layer 220, in accordance with some embodiments. The void 212 is in the hydrogen-containing portion U, in accordance with some embodiments. The cap layer 220 is filled into the void 212, in accordance with some embodiments. The hydrogen-containing portion 174 of the dielectric layer 170 surrounds the cap layer 220, in accordance with some embodiments. The hydrogen-containing portions U and 174 both contain nitrogen atoms and hydrogen atoms, in accordance with some embodiments.

The gate stack G1 contains less than 10 mol % of carbon, in accordance with some embodiments. The gate stack G1 contains from about 0.01 mol % of carbon to about 9 mol % of carbon, in accordance with some embodiments. If the gate stack contains greater than 10 mol % of carbon, the electrical properties of the gate stack may be negatively affected.

The gate stack G1 contains less than 2 mol % of chlorine, in accordance with some embodiments. The gate stack G1 contains from about 0.01 mol % of chlorine to about 1.5 mol % of chlorine, in accordance with some embodiments. If the gate stack contains greater than 2 mol % of chlorine, the electrical properties of the gate stack may be negatively affected.

Figure 4:
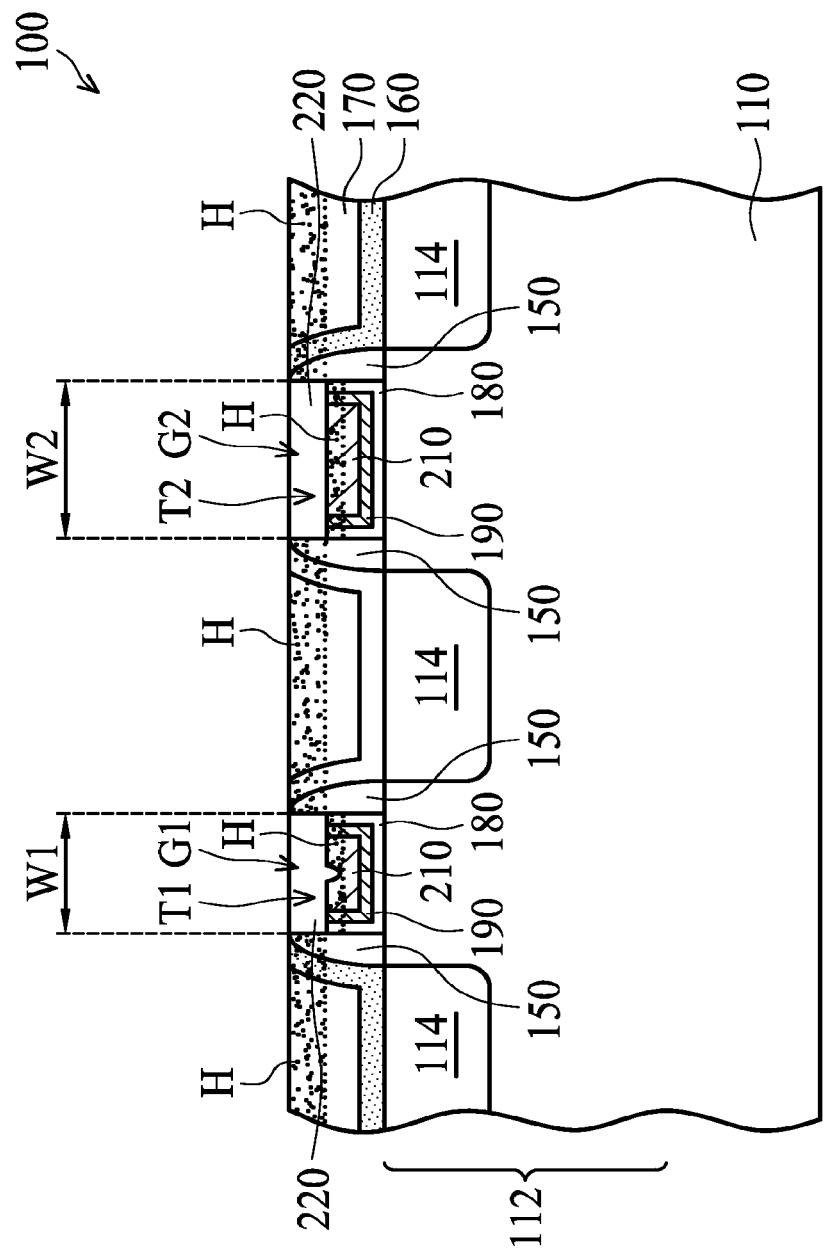
FIG. 4 is a cross-sectional view of a semiconductor device structure, in accordance with some embodiments.

FIG. 4 is a cross-sectional view of a semiconductor device structure, in accordance with some embodiments. The method of FIGS. 1A-3 may form more than one gate stack over the substrate 110. For example, as shown in FIG. 4, a gate stack G2 is formed adjacent to the gate stack G1, in accordance with some embodiments.

In some embodiments, spacers 150 surround the gate stack G2. In some embodiments, a gate dielectric layer 180 is formed between the gate stack G2 and the substrate 110 and between the gate stack G2 and the spacers 150. In some embodiments, the etch stop layer 160 covers the spacers 150. In some embodiments, a trench T2 is formed between the spacers 150, and the gate stack G2 is in the trench T2. In some embodiments, a width W2 of the trench T2 is greater than the width W1 of the trench T1. In some embodiments, a difference between the width W2 and the width W1 ranges from about 2 nm to about 10 nm.

The cleaning process and the hydrogen-containing plasma process reduce the residues of carbon, which prevents the residues of carbon from blocking the narrow trench T1 and hindering the etching process on the gate stack G1. Therefore, the removal process of FIG. 2L removes top portions of the gate dielectric layer 180, the work function layer 190, and the gate electrode layer 210 substantially equally in the narrow trench T1 and the wide trench T2 of FIG. 4, in accordance with some embodiments. As a result, the cap layer 220 in the narrow trench T1 has an enough thickness to prevent contacts from shorting with the gate stack G1.

In accordance with some embodiments, semiconductor device structures and methods for forming the same are provided. After a planarization process for forming a gate stack, the methods (for forming the semiconductor device structure) perform a cleaning process to remove residues resulting from the planarization process and to remove a top portion of the gate stack. The cleaning process may enlarge an opening of a void formed in the gate stack and reduce the depth of the void to help the removal of the residues in the void in subsequent processes.

Thereafter, the methods perform a hydrogen-containing plasma process to volatilize the residues of carbon into a gaseous hydrocarbon compound so as to reduce the residues of carbon, especially the residues in the void and the gate stack. Therefore, the hydrogen-containing plasma process helps the etching process performed on the gate stack subsequently.

In accordance with some embodiments, a method for forming a semiconductor device structure is provided. The method includes forming a dielectric layer over a substrate. The dielectric layer has a trench passing through the dielectric layer. The method includes forming a gate stack in the trench. The method includes performing a hydrogen-containing plasma process over the gate stack. The method includes removing a top portion of the gate stack to form a first recess surrounded by the gate stack and the dielectric layer. The method includes forming a cap layer in the first recess.

In accordance with some embodiments, a method for forming a semiconductor device structure is provided. The method includes forming a dielectric layer over a substrate. The dielectric layer has a trench passing through the dielectric layer. The method includes forming a gate stack in the trench. The gate stack has a void. The method includes performing a hydrogen-containing plasma process over the gate stack to remove residues of carbon over the gate stack and in the void. The method includes removing a top portion of the gate stack to form a first recess surrounded by the gate stack and the dielectric layer. The method includes forming a cap layer in the first recess to fill the first recess and the void.

In accordance with some embodiments, a semiconductor device structure is provided. The semiconductor device structure includes a substrate. The semiconductor device structure includes a dielectric layer over the substrate. The dielectric layer has a trench passing through the dielectric layer. The semiconductor device structure includes a gate stack in the trench. A recess is surrounded by the gate stack and the dielectric layer. The semiconductor device structure includes a cap layer in the recess. The gate stack has a first hydrogen-containing portion adjacent to the cap layer.

In accordance with some embodiments, a device includes a semiconductor substrate; a gate stack over the semiconductor substrate, wherein the gate stack comprises a gate electrode a first hydrogen-containing portion in the gate electrode; one or more gate spacers adjacent the gate stack and comprising a second hydrogen-containing portion, wherein the second hydrogen-containing portion extends above the first hydrogen-containing portion; and an insulating cap layer over the gate electrode. The first hydrogen-containing portion is disposed around a first portion of the insulating cap layer, and the second hydrogen-containing portion is disposed around a second portion of the insulating cap layer.

In accordance with some embodiments, a device includes a semiconductor substrate; a first gate electrode over the semiconductor substrate, wherein the first gate electrode comprises a first hydrogen-containing portion; a first insulating cap layer on the first gate electrode; a second gate electrode over the semiconductor substrate; and a second insulating cap layer on the second gate electrode. The second gate electrode comprises a second hydrogen-containing portion, and a top surface of the first gate electrode has a different profile than a top surface of the second gate electrode.

In accordance with some embodiments, a device includes a substrate, a dielectric layer over the substrate, a first gate stack in the dielectric layer, and a first cap layer over the first gate stack. The first gate stack has a first hydrogen-containing portion at an interface between the first gate stack and the first cap layer. A bottommost surface of the first cap layer is below a topmost surface of the first gate stack. The device further includes a gate spacer between the first gate stack and the dielectric layer. The gate spacer has a second hydrogen-containing portion. A topmost surface of the second hydrogen-containing portion is spaced apart from a major surface of the substrate by a greater distance than a topmost surface of the first hydrogen-containing portion.

In accordance with some embodiments, a device includes a semiconductor substrate and a gate stack over the semiconductor substrate. The gate stack includes a gate electrode and a first hydrogen-containing portion in the gate electrode. The device further includes one or more gate spacers adjacent the gate stack and comprising a second hydrogen-containing portion. A topmost surface of the second hydrogen-containing portion is spaced apart from a topmost surface of the semiconductor substrate by a greater distance than a topmost surface of the first hydrogen-containing portion. A bottommost surface of the second hydrogen-containing portion is spaced apart from the topmost surface of the semiconductor substrate by a greater distance than a bottommost surface of the first hydrogen-containing portion.

In accordance with some embodiments, a device includes a semiconductor substrate and a first gate electrode over the semiconductor substrate. The first gate electrode comprises a first hydrogen-containing portion. The device further includes a first insulating cap layer on the first gate electrode. A bottommost surface of the first insulating cap layer is below a topmost surface of the first gate electrode. The device further includes a dielectric layer surrounding the first insulating cap layer. The dielectric layer has a second hydrogen-containing portion. The second hydrogen-containing portion is above the first hydrogen-containing portion. The device further includes a spacer between the first insulating cap layer and the dielectric layer. The spacer has a third hydrogen-containing portion. The third hydrogen-containing portion is level with the second hydrogen-containing portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate;
a dielectric layer over the substrate;
a first gate stack in the dielectric layer;
a first cap layer over the first gate stack, wherein the first gate stack has a first hydrogen-containing portion at an interface between the first gate stack and the first cap layer, and wherein a bottommost surface of the first cap layer is below a topmost surface of the first gate stack; and
a gate spacer between the first gate stack and the dielectric layer, wherein the gate spacer has a second hydrogen-containing portion, and wherein a topmost surface of the second hydrogen-containing portion is spaced apart from a major surface of the substrate by a greater distance than a topmost surface of the first hydrogen-containing portion.

2. The device of claim 1, wherein the dielectric layer has a third hydrogen-containing portion adjacent the first cap layer.

3. The device of claim 2, wherein a topmost surface of the third hydrogen-containing portion is level with the topmost surface of the second hydrogen-containing portion.

4. The device of claim 1, wherein the first gate stack includes from about 0.01 mol % of carbon to about 9 mol % of carbon.

5. The device of claim 1, wherein the first gate stack includes from about 0.01 mol % of chlorine to about 1.5 mol % of chlorine.

6. The device of claim 1, wherein the first hydrogen-containing portion further comprises nitrogen.

7. The device of claim 1, wherein a bottommost surface of the first hydrogen-containing portion is below the bottommost surface of the first cap layer.

8. A device comprising:
a semiconductor substrate;
a gate stack over the semiconductor substrate, wherein the gate stack comprises:
a gate electrode; and
a first hydrogen-containing portion in the gate electrode; and
one or more gate spacers adjacent the gate stack and comprising a second hydrogen-containing portion, wherein a topmost surface of the second hydrogen-containing portion is spaced apart from a topmost surface of the semiconductor substrate by a greater distance than a topmost surface of the first hydrogen-containing portion, and wherein a bottommost surface of the second hydrogen-containing portion is spaced apart from the topmost surface of the semiconductor substrate by a greater distance than a bottommost surface of the first hydrogen-containing portion.

9. The device of claim 8, further comprising an insulating cap layer over the gate electrode, wherein the first hydrogen-containing portion surrounds a first portion of the insulating cap layer, and wherein the second hydrogen-containing portion surrounds a second portion of the insulating cap layer, the second portion of the insulating cap layer being above the first portion of the insulating cap layer.

10. The device of claim 9, wherein a portion of the insulating cap layer extend below a topmost surface of the gate electrode.

11. The device of claim 9, wherein a bottommost surface of the insulating cap layer is interposed between the bottommost surface of the first hydrogen-containing portion and the bottommost surface of the second hydrogen-containing portion.

12. The device of claim 8, further comprising a dielectric layer over the semiconductor substrate, the gate stack extending through the dielectric layer, wherein the dielectric layer comprises a third hydrogen-containing portion adjacent the second hydrogen-containing portion.

13. The device of claim 12, wherein a topmost surface of the third hydrogen-containing portion is level with the topmost surface of the second hydrogen-containing portion.

14. The device of claim 8, wherein the first hydrogen-containing portion further comprises nitrogen, tungsten, aluminum, gold, platinum, cobalt, carbon, or a combination thereof.

15. A device comprising:
a semiconductor substrate;
a first gate electrode over the semiconductor substrate, wherein the first gate electrode comprises a first hydrogen-containing portion;
a first insulating cap layer on the first gate electrode, wherein a bottommost surface of the first insulating cap layer is below a topmost surface of the first gate electrode;
a dielectric layer surrounding the first insulating cap layer, wherein the dielectric layer has a second hydrogen-containing portion, the second hydrogen-containing portion being above the first hydrogen-containing portion; and
a spacer between the first insulating cap layer and the dielectric layer, wherein the spacer has a third hydrogen-containing portion, the third hydrogen-containing portion being level with the second hydrogen-containing portion.

16. The device of claim 15, wherein the bottommost surface of the first insulating cap layer is above a bottommost surface of the first hydrogen-containing portion.

17. The device of claim 15, wherein a topmost surface of the first insulating cap layer is level with a topmost surface of the dielectric layer.

18. The device of claim 15, wherein the first hydrogen-containing portion has a first concentration of hydrogen, and wherein a portion of the first gate electrode below the first hydrogen-containing portion has a second concentration of hydrogen different from the first concentration of hydrogen.

19. The device of claim 18, wherein the first concentration of hydrogen is greater than the second concentration of hydrogen.

20. The device of claim 18, wherein a ratio of the first concentration of hydrogen to the second concentration of hydrogen is in the range of 2 to 100.

* * * * *